(12) United States Patent
Kim et al.

(10) Patent No.: US 9,591,745 B2
(45) Date of Patent: Mar. 7, 2017

(54) DISPLAY APPARATUS REDUCING DEAD SPACE

(71) Applicant: SAMSUNG DISPLAY CO., LTD., Yongin, Gyeonggi-Do (KR)

(72) Inventors: Yang-Wan Kim, Yongin (KR); Won-Kyu Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 239 days.

(21) Appl. No.: 14/454,701

(22) Filed: Aug. 7, 2014

(65) Prior Publication Data
US 2015/0208522 A1  Jul. 23, 2015

(30) Foreign Application Priority Data
Jan. 22, 2014 (KR) .......... 10-2014-0007941

(51) Int. Cl.
| H05K 1/00 | (2006.01) |
|---|---|
| H05K 1/02 | (2006.01) |
| H01L 27/32 | (2006.01) |
| G02F 1/1345 | (2006.01) |
| H05K 1/14 | (2006.01) |
| H05K 1/18 | (2006.01) |
| H05K 3/36 | (2006.01) |

(52) U.S. Cl.
CPC ........ *H05K 1/028* (2013.01); *H01L 27/3276* (2013.01); *H01L 27/3297* (2013.01); *H05K 1/147* (2013.01); *H05K 1/189* (2013.01); *H05K 3/361* (2013.01); *H05K 2201/05* (2013.01); *H05K 2201/052* (2013.01); *H05K 2201/053* (2013.01); *H05K 2201/055* (2013.01); *H05K 2201/10106* (2013.01); *H05K 2201/10128* (2013.01)

(58) Field of Classification Search
CPC ..... H05K 2201/05; H05K 2201/10681; H05K 1/0277; H05K 1/028; H05K 1/0283; H05K 1/147; H05K 1/189; H01L 2224/50; H01L 2224/79; H01L 2225/107; G02F 1/13458; G02F 2001/13456; G09G 2290/00
USPC ................... 361/749; 349/149–152
See application file for complete search history.

(56) References Cited

U.S. PATENT DOCUMENTS

| 6,750,926 B2 * | 6/2004 | Ohgiichi ............. G02F 1/1345 324/760.01 |
| 2005/0018409 A1 * | 1/2005 | Hirakata ............... H05K 1/028 361/752 |

(Continued)

FOREIGN PATENT DOCUMENTS

| JP | 2008-107514 A | 5/2008 |
| JP | 2012-116087 A | 6/2012 |

(Continued)

*Primary Examiner* — Binh Tran
(74) *Attorney, Agent, or Firm* — Lewis Roca Rothgerber Christie LLP

(57) ABSTRACT

A display device includes a display panel including a substrate having a display area and a non-display area outside the display area, a display unit being in the display area, and a plurality of pads in the non-display are, a sealing unit covering the display unit, and a circuit board including a plurality of terminals electrically coupled to the plurality of pads. The circuit board has a plurality of folding portions such that the circuit board is folded at least two times in directions different from each other.

20 Claims, 13 Drawing Sheets

(56) References Cited

U.S. PATENT DOCUMENTS

| | | | |
|---|---|---|---|
| 2010/0208162 A1* | 8/2010 | Lee | G02F 1/13452 349/58 |
| 2011/0221688 A1* | 9/2011 | Byun | H04B 1/385 345/173 |
| 2012/0133711 A1 | 5/2012 | Hiwada | |

FOREIGN PATENT DOCUMENTS

| | | |
|---|---|---|
| KR | 10-2006-0042489 A | 5/2006 |
| KR | 10-2006-0125326 A | 12/2006 |
| KR | 10-2013-0024097 A | 3/2013 |

\* cited by examiner

DISPLAY APPARATUS REDUCING DEAD SPACE

CROSS-REFERENCE TO RELATED APPLICATION

This application claims priority to and the benefit of Korean Patent Application No. 10-2014-0007941, filed on Jan. 22, 2014 in the Korean Intellectual Property Office, the disclosure of which is incorporated herein in its entirety by reference.

BACKGROUND

1. Field

Aspects of embodiments of the present invention relate to a display apparatus.

2. Description of the Related Art

In general, organic light emitting display devices (OLEDs) provided with thin film transistors (TFTs) are being used in mobile display devices, such as smart phones, digital cameras, camcorders, personal digital assistants (PDAs), ultra-slim laptops, tablet personal computers, and the like and in electronic and electrical equipment, such as ultra-thin televisions and the like.

Such an OLED includes an organic light emitting device including a first electrode, a second electrode, and an intermediate layer that is disposed between the first and second electrodes. The OLED has a wide viewing angle, excellent contrast, and fast response speed.

Generally, in a display device such as the OLED, a pad and a circuit board are electrically connected to each other. When the pad and the circuit board are connected, an area at which the pad is connected to the circuit board should be reduced or minimized.

SUMMARY

Aspects of embodiments of the present invention provide a display apparatus in which a pad and a circuit board are easily coupled to each other.

An embodiment of the present invention includes a display device including: a display panel including a substrate having a display area and a non-display area outside the display area, a display unit being in the display area and, a plurality of pads being in the non-display area; a sealing unit covering the display unit; and a circuit board including a plurality of terminals electrically coupled to the plurality of pads, wherein the circuit board has a plurality of folding portions such that the circuit board is folded at least two times in directions different from each other.

According to one or more embodiments of the present invention, the circuit board may include: a flexible film; a first terminal at a first edge of the flexible film, the first terminal being electrically coupled to the pads; and a second terminal at a second edge of the flexible film, the second terminal configured to be coupled to an external device, wherein the plurality of folding portions may be foldable lines.

According to one or more embodiments of the present invention, a portion folded at each of the folding portions may be on a second surface of the substrate that is opposite to a first surface of the substrate on which the pads are arranged.

According to one or more embodiments of the present invention, the plurality of folding portions may include: a first folding portion extending in a first direction of the flexible film; and a second folding portion between the first edge of the flexible film and the first folding portion, the second folding portion extending across the flexible film.

According to one or more embodiments of the present invention, the first folding portion may extend in the same direction as a direction along which the plurality of pads are arranged.

According to one or more embodiments of the present invention, a portion of the flexible film that is folded at least two times at the first and second folding portions may be on a second surface of the substrate that is opposite to a first surface of the substrate on which the pads are arranged.

According to one or more embodiments of the present invention, a plurality of slits may be between the first and second edges of the flexible film.

According to one or more embodiments of the present invention, the plurality of pads may include a plurality of pad groups, each pad group being separately arranged along directions different from other ones of the pad groups.

According to one or more embodiments of the present invention, the plurality of pad groups may include a first pad group and a second pad group separately arranged along directions different from each other, the pads of the first pad group may be arranged along an outer periphery of the display area, and the pads of the second pad group may be arranged along the outer periphery of the display area.

According to one or more embodiments of the present invention, the circuit board may include: a flexible film including a plurality of blocks separated from each other; a plurality of first terminals respectively on the plurality of the blocks, the plurality of first terminals respectively coupled to the pads of the plurality of pad groups; and a second terminal on the flexible film, the second terminal configured to be coupled to an external device, wherein the plurality of folding portions may be foldable lines.

According to one or more embodiments of the present invention, the blocks of the flexible film may include a first block and a second block separated from the first block and extending from an edge of the flexible film at an angle different from that of the first block, and the first terminal and the second terminal may be respectively on the first and second blocks at angles corresponding to angles of the pads of the respective pad groups.

According to one or more embodiments of the present invention, the plurality of folding portions may include: a first folding portion in each of the plurality of blocks; and a second folding portion between the plurality of blocks and an edge of the flexible film and extending across the flexible film.

According to one or more embodiments of the present invention, a portion of the flexible film that is folded at least two times at the first and second folding portions may be on a second surface of the substrate that is opposite to a first surface of the substrate on which the pads are arranged.

According to one or more embodiments of the present invention, the plurality of pad groups may include at least three pad groups that are separated from each other, and the pads of each of the pad groups may be at angles different from each other along an outer periphery of the display area with respect to a center of the display area.

According to one or more embodiments of the present invention, the display panel may have a circular shape.

According to one or more embodiments of the present invention, the plurality of pads may be arranged along an outer periphery of the display area, and each of the terminals of the circuit board may have a shape corresponding to that of each of the pads, each terminal being coupled to a respective pad.

According to one or more embodiments of the present invention, at least one portion of the substrate may extend to past edge of the sealing unit, and the at least one portion may correspond to the non-display area at which the pads are arranged.

Additional aspects will be set forth in part in the description which follows and, in part, will be apparent from the description or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
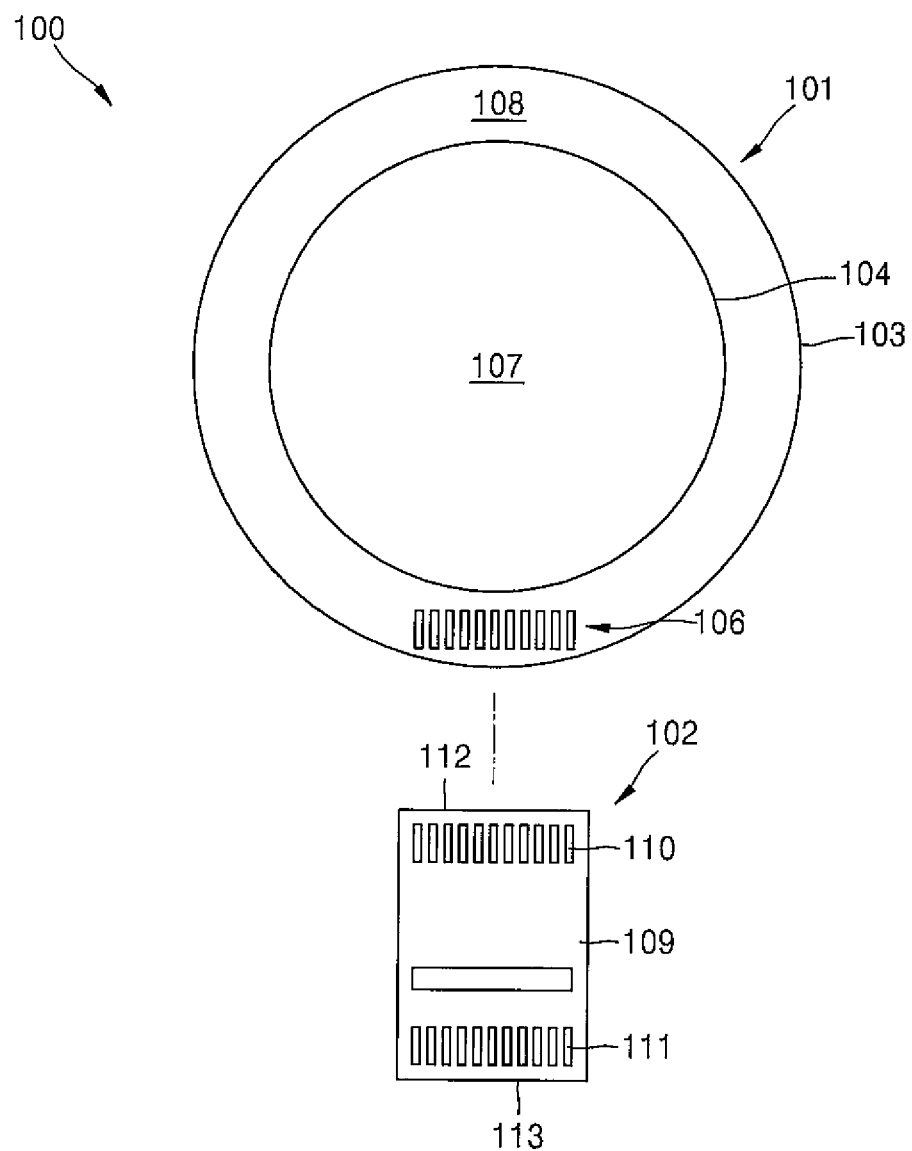
FIG. 1A is a plan view illustrating a state in which a pad is not coupled to a circuit board of a display device according to an embodiment of the present invention.

Reference will now be made in detail to embodiments, examples of which are illustrated in the accompanying drawings, wherein like reference numerals refer to like elements throughout. The present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention relates to "one or more embodiments of the present invention."

The present invention may be embodied in many different forms, and thus, example embodiments are illustrated in figures and described herein. While the present invention has been particularly shown and described with reference to example embodiments thereof, it will be understood by those of ordinary skill in the art that various changes in form and details may be made therein without departing from the spirit and scope of the present invention as defined by the following claims and their equivalents.

It will be understood that although the terms "first" and "second" are used herein to describe various elements, these elements should not be limited by these terms. Terms are only used to distinguish one component from other components.

In the following description, technical terms are used only to explain a specific example embodiment while not limiting the present invention. The terms of a singular form may include plural forms unless referred to on the contrary. The meaning of "include," "comprise," "including," or "comprising," specifies a property, a region, a fixed number, a step, a process, an element, and/or a component but does not exclude other properties, regions, fixed numbers, steps, processes, elements, and/or components.

Hereinafter, the present invention will be described in detail by explaining example embodiments of the invention with reference to the attached drawings. Like reference numerals in the drawings denote like elements, and repeated descriptions with respect thereto may be omitted.

FIG. 1A is a plan view illustrating a state in which a pad 106 is not coupled to (e.g., connected to) a circuit board 102 of a display device 100 according to an embodiment of the present invention.

Although the display device 100 refers to an organic light emitting display device in the current embodiment, the present disclosure is not limited thereto. For example, any display device receiving power to realize (e.g., display) an image may be applied to embodiments of the present invention.

Referring to FIG. 1, the display device 100 includes a display panel 101 and the circuit board 102.

A substrate 103 is provided in the display panel 101. The substrate 103 includes a display area 107 in which a display unit (reference numeral 105 of FIG. 5) is disposed and a non-display area 108 outside of (e.g., extending to the outside of) the display area 107.

An organic light emitting device (OLED) may be disposed in the display unit 105 to realize (e.g., display) an image when power is applied thereto. A plurality of pads 106 electrically coupled to (e.g., electrically connected to) devices in the display unit 105 are arranged in the non-display area 108.

A sealing unit 104 covering the display unit 105 is disposed above the substrate 103. The sealing unit 104 is large enough to cover the display area 107.

The circuit board 102 for receiving a signal from outside the display device 100 is coupled to the pad 106. The circuit board 102 may be a flexible printed circuit board (FPCB).

To reduce an area at which the circuit board 102 is coupled to the pad 106, a plurality of folding portions (reference numerals 114 and 115 of FIG. 1C), which correspond to portions that are folded at least two times in directions different from each other, are disposed on the circuit board 102.

This will be described in further detail as follows.

Figure 1B:
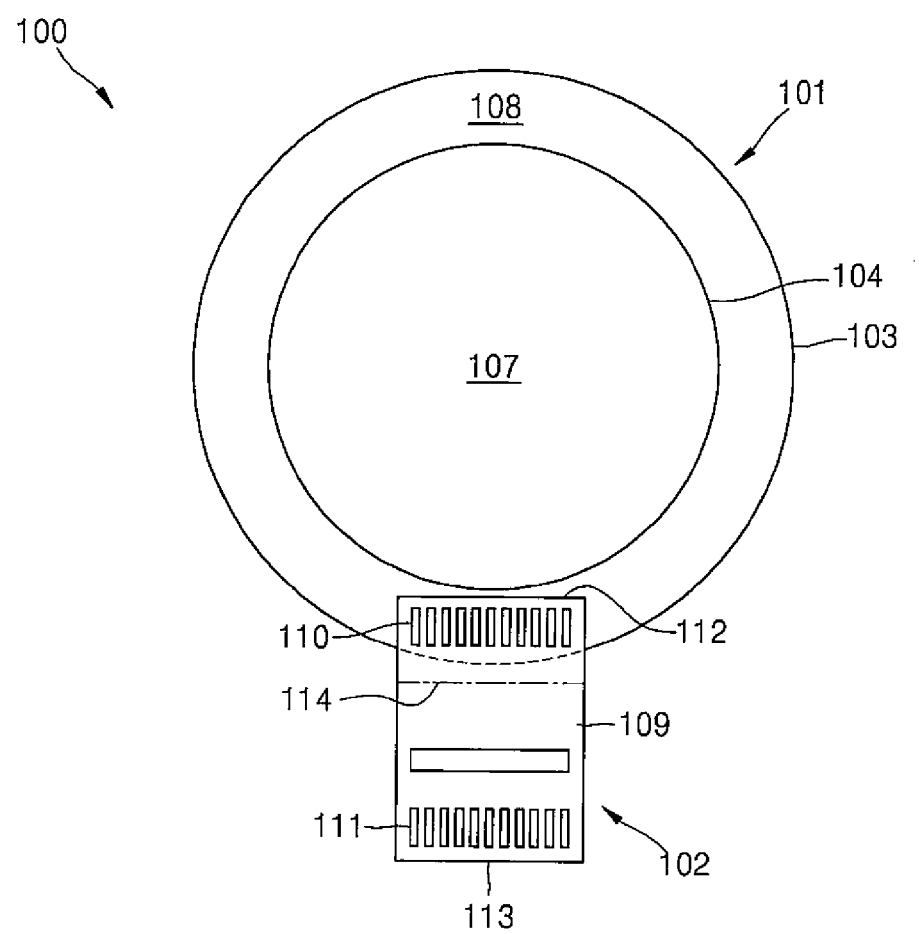
FIG. 1B is a plan view illustrating a state in which the pad and the circuit board shown in FIG. 1A are coupled to each other.

FIG. 1B is a plan view illustrating a state in which the pad 106 and the circuit board 102 shown in FIG. 1A are coupled to each other.

Referring to the figure, the circuit board 102 includes a flexible film 109, a first terminal 110 at a first edge 112 of the flexible film 109 and electrically coupled to the pad 106, and a second terminal 111 at a second edge 113 of the flexible film 109 and coupled to an external device. The first edge 112 is at an opposite side of the flexible film 109 as the second edge 113.

The display panel 101 may have at least one curved portion. In the current embodiment, the display panel 101 has a circular shape.

The substrate 103 has a circular shape. The display area 107 disposed on the substrate 103 may have a circular shape, and also, the non-display area 108 outside of the display area 107 may have a circular shape.

The pads (reference numeral 106 of FIG. 1A) are disposed in the non-display area 108. A portion of the substrate 103 extends to an edge of the sealing unit 104 (see FIG. 5) and is exposed to the outside (e.g., exposed from the sealing unit 104). The exposed area corresponds to the non-display area at which the pads 106 are disposed.

The pads 106 are disposed along an outer profile of (e.g., along an outer periphery of) the display area 107. The first terminal 110 of the circuit board 102 has a shape corresponding to that of the pad 106 and is coupled to the pad 106.

Although the display panel 101 has a circular shape in the current embodiment, the display panel 101 may be manufactured in other shapes, such as a rectangular, an oval, and the like.

The first folding portion 114 extends in a first direction of the flexible film 109 and is disposed on the flexible film 109. In the current embodiment, the first folding portion 114 is a folding line extending in a width direction of the flexible film 109. The flexible film 109 may be easily folded at the first folding portion 114. The first folding portion 114 extends in the same direction as the direction in which the plurality of pads 106 are arranged (e.g., spaced from each other by a distance).

Thus, the first terminal 110 of the circuit board 102 is coupled to the pad 106, and then the circuit board 102 is folded once along the first folding portion 114.

Figure 1C:
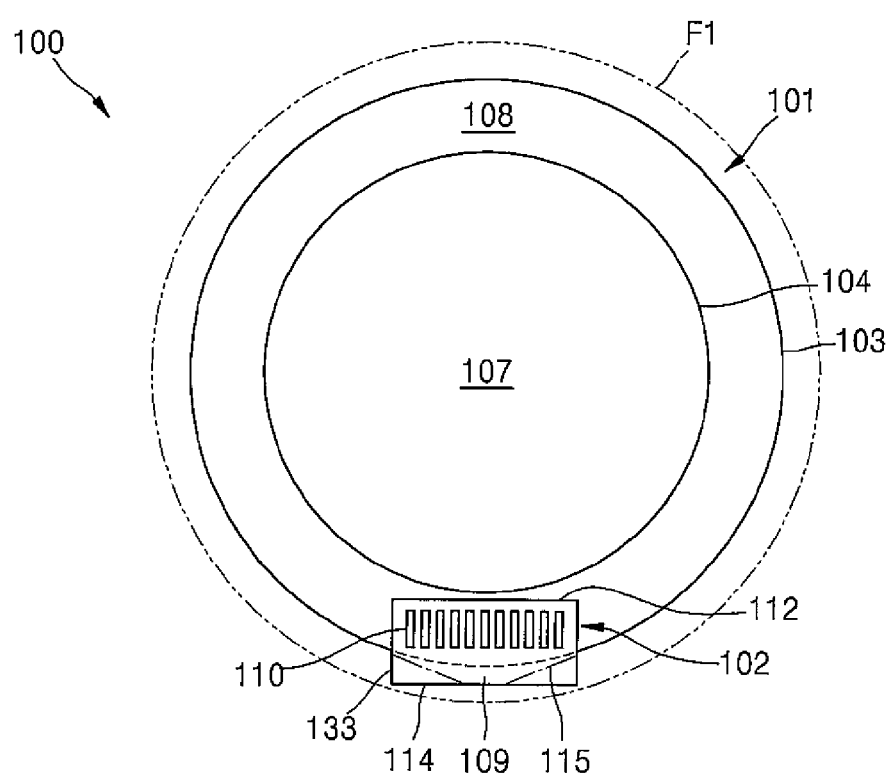
FIG. 1C is a plan view illustrating a state in which the circuit board shown in FIG. 1B is folded once.

FIG. 1C is a plan view illustrating a state in which the circuit board 102 shown in FIG. 1B is folded once.

Referring to the figure, the circuit board 102 is folded once.

Thus, an area from the first edge 112 of the flexible film 109 to the first folding portion 114 is defined on a front surface of the substrate 103, that is, on the substrate 103 where the pad (reference numeral 106 of FIG. 1A) is coupled to the first terminal 110 of the circuit board 102. An area from the first folding portion 114 to the second edge (reference numeral 113 of FIG. 1A) of the flexible film 109 is defined on a rear surface of the substrate 103.

When the flexible film 109 is folded once at the first folding portion 114, there is dead space from the outside of the non-display area 108 to the first folding portion 114 of the circuit board 102, defined as area F1 (e.g., an area from the non-display area 108 to the area in which the flexible film 109 is folded once).

The second folding portion 115 is disposed on the flexible film 109 to further fold the flexible film 109. The second folding portion 115 is disposed between the first edge 112 and first folding portion 114 of the flexible film 109.

The second folding portion 115 is a line that extends diagonally from both edges 133 of the flexible film 109, which extend in a length direction crossing the first and second edges 112 and 113, to the first folding portion 114 across the flexible film 109.

Although the second folding portion 115 is a line that is formed across the flexible film 109 in the current embodiment, the present disclosure is not limited thereto. For example, any line that enables easier folding of the flexible film 109 may be additionally used.

Figure 1D:
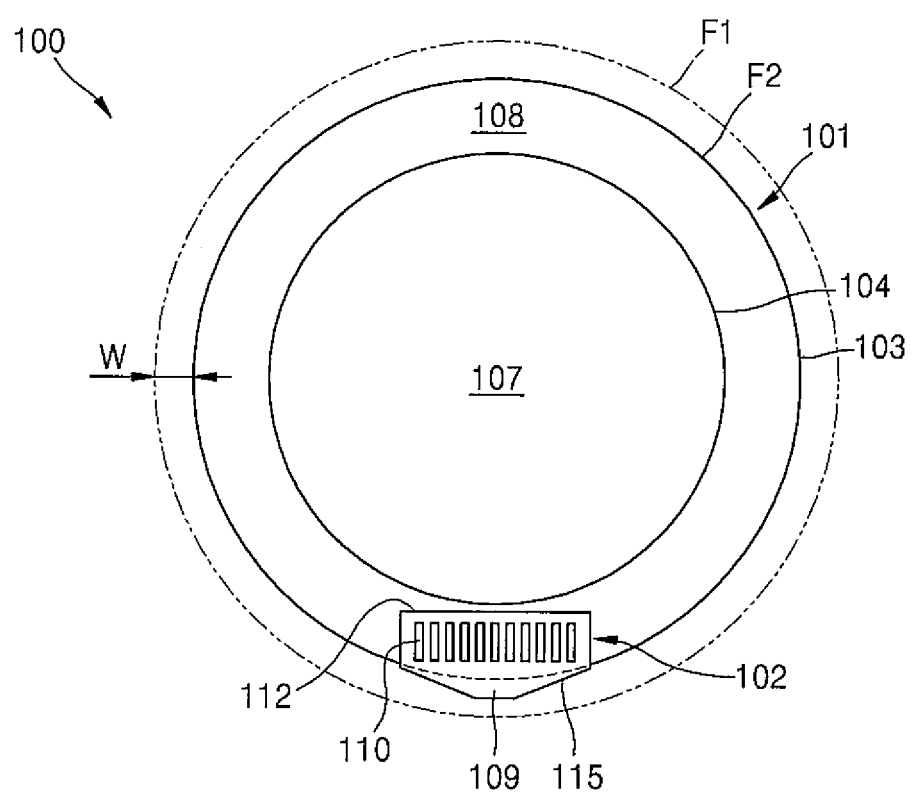
FIG. 1D is a plan view illustrating a state in which the circuit board shown in FIG. 1B is folded two times.

FIG. 1D is a plan view illustrating a state in which the circuit board 102 shown in FIG. 1B is folded two times.

Referring to FIG. 1D, the circuit board 102 is folded twice.

Thus, an area from the first edge 112 to a portion of the first folding portion (reference numeral 114 of FIG. 1C) and the second folding portion 115 is defined on the front surface of the substrate 103. An area from a portion of the first folding portion 114 and second folding portion 115 to the second edge (reference numeral 113 of FIG. 1A) of the flexible film 109 is defined on the rear surface of the substrate 103.

As described above, a portion of the flexible film 109 that is folded at the first and second folding portions 114 and 115 is disposed on the rear surface of the substrate 103 that is opposite to the front surface of the substrate 103.

Because the flexible film 109 is folded a second time at the second folding portion 115, the dead space may be further reduced by a distance from the area F1 in which the circuit board 102 is folded once to the area F2 in which the circuit board 102 is folded twice.

Figure 1E:
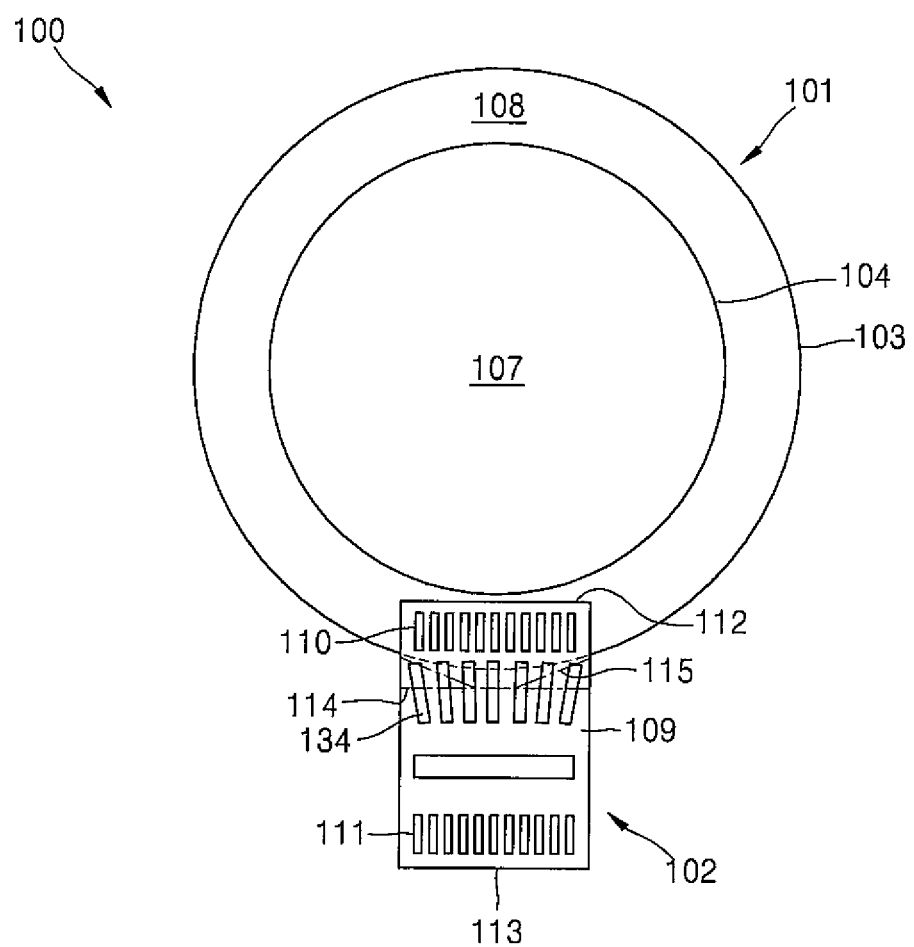
FIG. 1E is a plan view illustrating a state in which a slit is in the circuit board shown in FIG. 1B.

FIG. 1E is a plan view illustrating a state in which a slit 134 is in the circuit board 102 shown in FIG. 1B.

Referring to the figure, a plurality of slits 134 are defined between the first edge 112 and the second edge 113 in the flexible film 109.

Each slit 134 is an opening having a stripe shape defined in a generally longitudinal direction (e.g., the length direction) of the flexible film 109. A plurality of slits 134 are spaced from each other by a distance along the width direction of the flexible film 109. Because the plurality of slits 134 are defined in (e.g., extends across) the foldable portions of the flexible film 109, the circuit board 102 may have improved foldability (e.g., may be easier to fold).

Figure 2A:
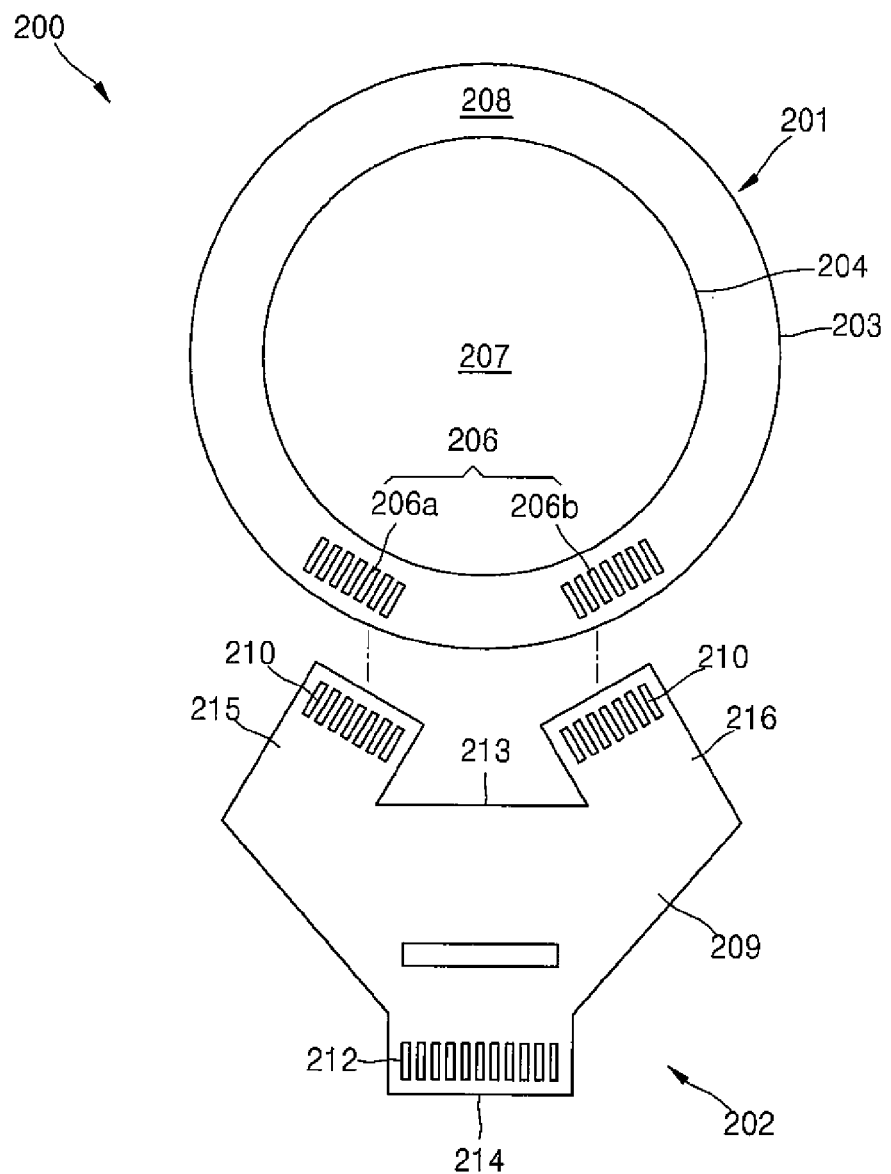
FIG. 2A is a plan view illustrating a state before a pad is coupled to a circuit board of a display device according to another embodiment of the present invention.

FIG. 2A is a plan view illustrating a state before a pad 206 is coupled to a circuit board 202 of a display device 200 according to another embodiment of the present invention.

Referring to the figure, the display device 200 includes a display panel 201 and the circuit board 202.

A substrate 203 is provided in the display panel 201. The substrate 203 includes a display area 207 in which a display unit is disposed and a non-display area 208 outside of (e.g., extending to the outside of) the display area 207. A plurality of pads 206 are arranged in the non-display area 208. A sealing unit 204 is disposed above the substrate 203. The sealing unit 204 is large enough to cover the display area 207.

The circuit board 202 for receiving a signal from outside the display device 200 is coupled to the pads 206. In this embodiment, a plurality of pads 206 includes a plurality of pad groups 206a and 206b which are separately disposed at angles different from each other. The circuit board 202 corresponds to the plurality of pads 206.

This will be described in further detail as follows.

The pads 206 include a first pad group 206a arranged along an outer profile of (e.g., along a periphery of) the display area 207 and a second pad group 206b separately arranged at an angle different from that of the first pad group 206a (e.g., arranged along a direction different from the first pad group 206a).

The pads of the first pad group 206a are disposed along the outer profile of the display area 207 at a first angle with respect to the center of the display panel 201. The pads of the second pad group 206b are disposed along the outer profile of (e.g., along the periphery of) the display area 207 at a second angle with respect to the center of the display panel 201. The pads provided in the first pad group 206a may be spaced from each other by a same distance (e.g., arranged at an interval), and the pads provided in the second pad group 206b may be spaced from each other by the same distance.

The circuit board 202 includes a flexible film 209, first terminals 210 to be coupled to the pads 206, and a second terminal 212 to be coupled to the external device.

The flexible film 209 includes a plurality of blocks 215 and 216 that protrude from a first edge 213. The plurality of blocks 215 and 216 include a first block 215 and a second block 216 separately disposed at an angle different from the first block 215.

The first block 215 and the second block 216 protrude from both sides of (e.g., opposite ends of) the first edge 213 by a length, respectively. The first and second blocks 215 and 216 have inclined angles (e.g., angles inclined with respect to the first edge 213) which are substantially the same as those of the first and second pad groups 206a and 206b, respectively. The first and second pad groups 206a and 206b are separately arranged at angles different from each other along an outer profile of (e.g., along a periphery of) the display area 207.

First terminals 210 are respectively disposed on the first and second blocks 215 and 216 and respectively coupled to the first and second pad groups 206a and 206b. The first terminals 210 are disposed at angles corresponding to those of the pads of the first pad group 206a and the pads of the second pad group 206b to which they are coupled.

Figure 2B:
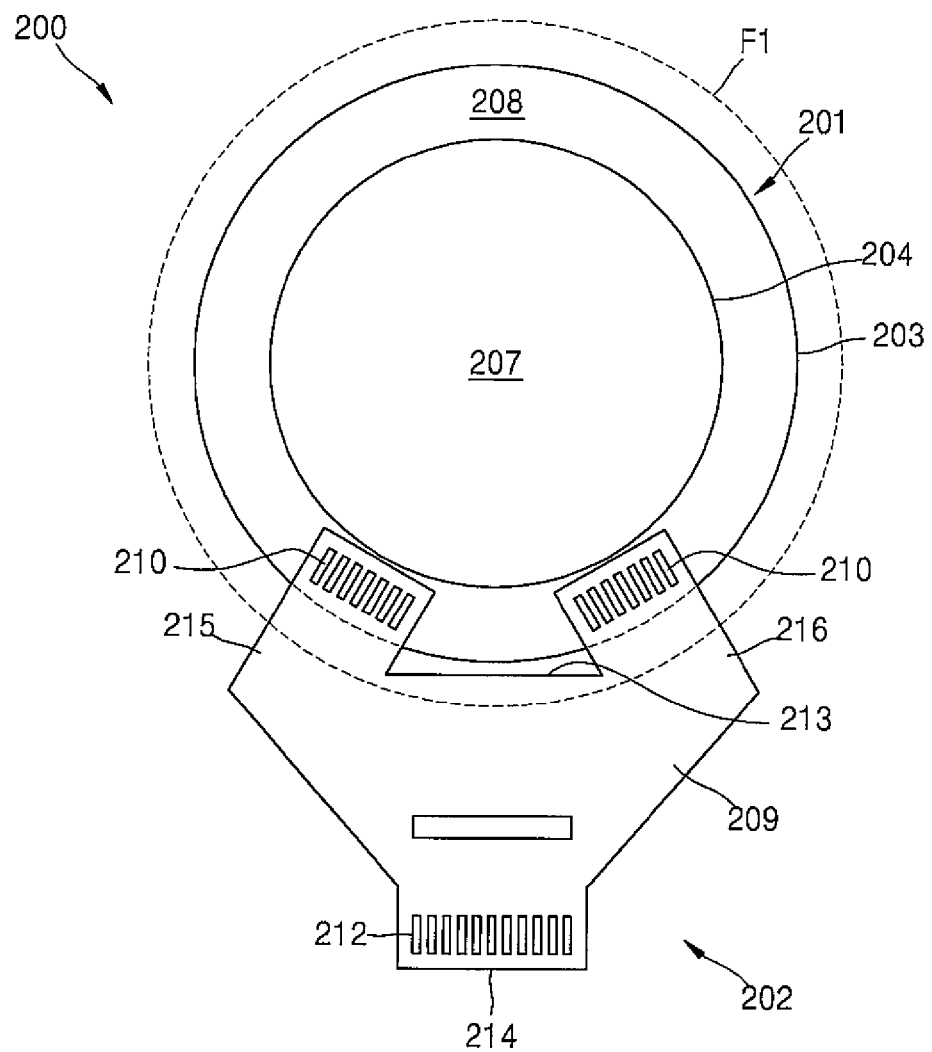
FIG. 2B is a plan view illustrating a state in which the pad and the circuit board shown in FIG. 2A are coupled to each other.

FIG. 2B is a plan view illustrating a state in which the pad 206 and the circuit board 202 shown in FIG. 2A are coupled to each other.

Referring to the figure, the circuit board 202 includes the flexible film 209 having the first and second blocks 215 and 216, the first terminals 210 respectively disposed on the first and second blocks 215 and 216, and the second terminal 212 disposed on a second edge 214 of the flexible film 209 to be coupled to an external device.

The display panel 201 may have at least one curved portion. In the current embodiment, the display panel 201 has a circular shape. Each of the substrate 203, the display area 207, and the non-display area 208 may have a circular shape.

A plurality of folding portions 217, 218, and 219 are disposed on portions corresponding to the foldable portions of the flexible film 209.

Figure 3:
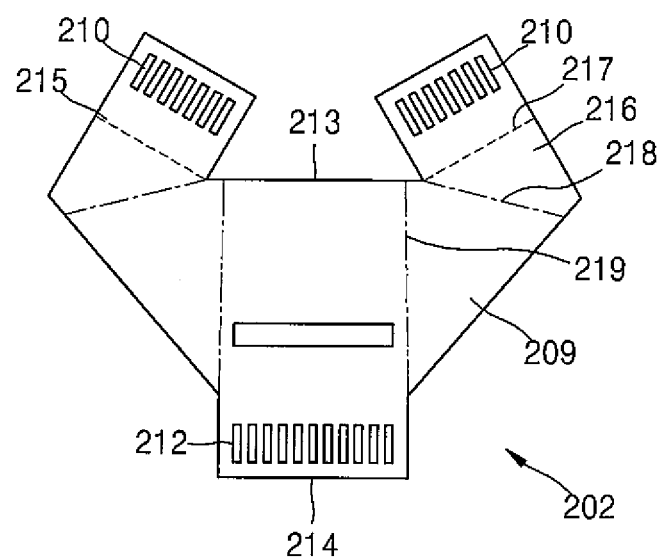
FIG. 3 is a plan view of the circuit board shown in FIG. 2A.

The circuit board 202 including the plurality of folding portions 217, 218, and 219 is illustrated in FIG. 3.

Referring to the figure, the flexible film 209 includes a first folding portion 217 that is a foldable line respectively disposed on the first and second blocks 215 and 216 and second and third folding portions 218 and 219, which are foldable lines disposed between the first folding portion 217 and the second edge 214 of the flexible film 209, extend across the flexible film 209. The number of first to third folding portions 217, 218, and 219 may be different according to the number of times the flexible film 209 is to be folded.

The first folding portion 217 is respectively disposed in the same direction as the direction in which the pads of the first pad group (reference numeral 206a of FIG. 2A) and the pads of the second pad group (reference numeral 206b of FIG. 2A) are spaced from each other (e.g., the direction along which the pads of the first and second groups 206a and 206b are respectively arranged). The flexible film 209 may be easily folded at the first folding portion 217. In the current embodiment, the first folding portion 217 is a line extending in a width direction of the first and second blocks 215 and 216.

The first terminals 210 of the circuit board 202 are respectively coupled to the first and second pad groups 206a and 206b, and then the circuit board 202 is folded along the first, second, and third folding portions 217, 218, and 219 several times.

Figure 2C:
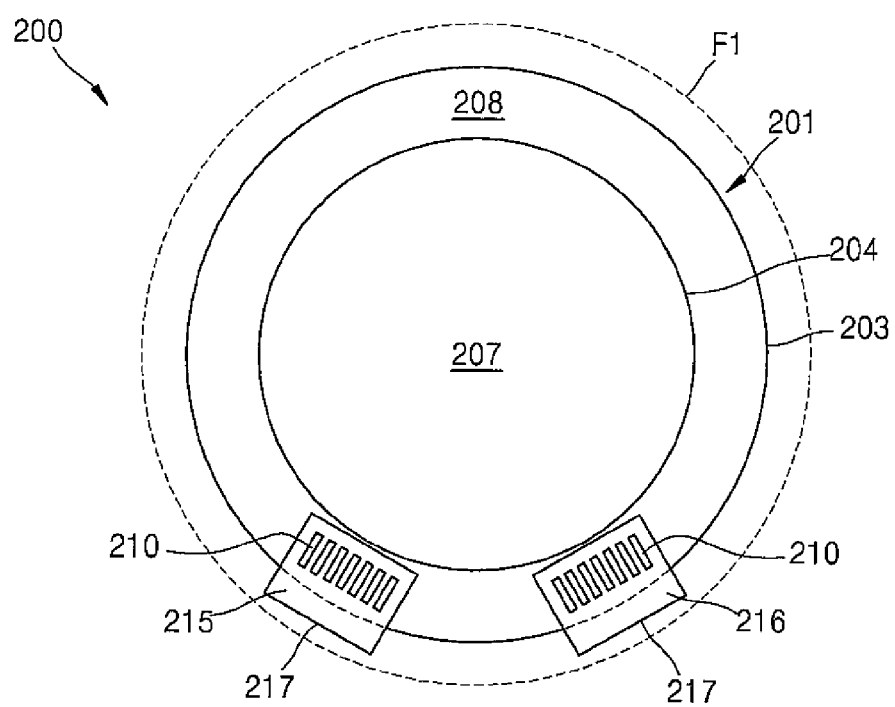
FIG. 2C is a front view illustrating a state in which the circuit board shown in FIG. 2B is folded.
Figure 2D:
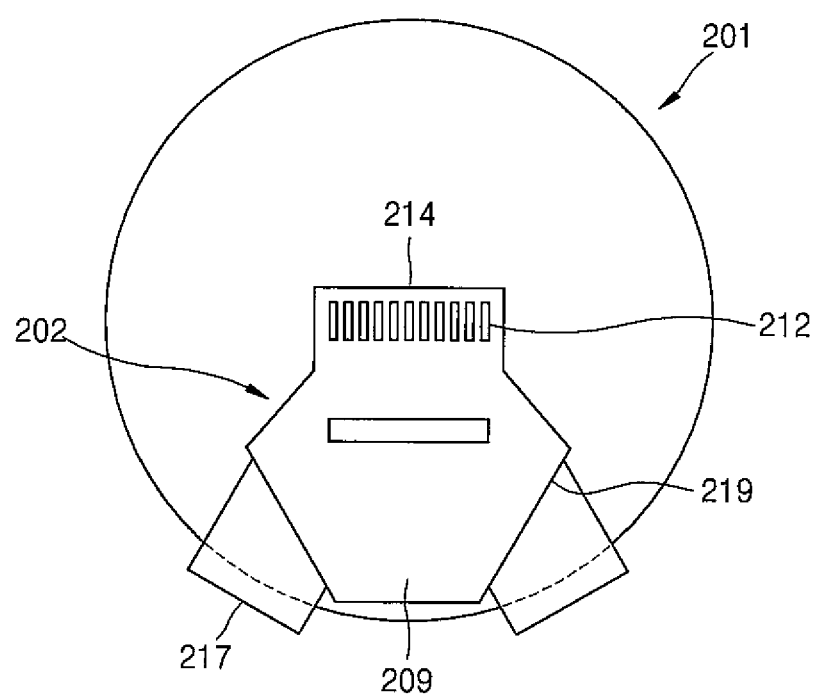
FIG. 2D is a rear view illustrating a state in which the circuit board shown in FIG. 2B is folded.

FIG. 2C is a front view illustrating a state in which the circuit board 202 shown in FIG. 2B is folded, and FIG. 2D is a rear view illustrating a state in which the circuit board 202 shown in FIG. 2B is folded.

Referring to FIGS. 2C and 2D, an area from the first and second blocks 215 and 216 of the flexible film 209 to the first folding portion 217 may be defined on the front surface of the substrate 203. An area from the first folding portion 217 to the second edge 214 of the flexible film 114 may be defined on the rear surface of the substrate 203.

As described above, the first terminals 210 of the flexible film 209 electrically coupled to the pads of the first pad group (reference numeral 206a of FIG. 2A) and to the pads of the second pad group (reference numeral 206b of FIG. 2A) are disposed on the front surface of the substrate 203, and the second terminal 214 of the flexible film 209 coupled to an external device is disposed on the rear surface of the substrate 203.

In this embodiment, because the flexible film 209 is folded several times at the first, second, and third folding portions 217, 218, and 219, the dead space from the outside of the non-display area 208 to the first folding portion 217 at which the circuit board 202 is folded (denoted by area F1) may be reduced.

Figure 4:
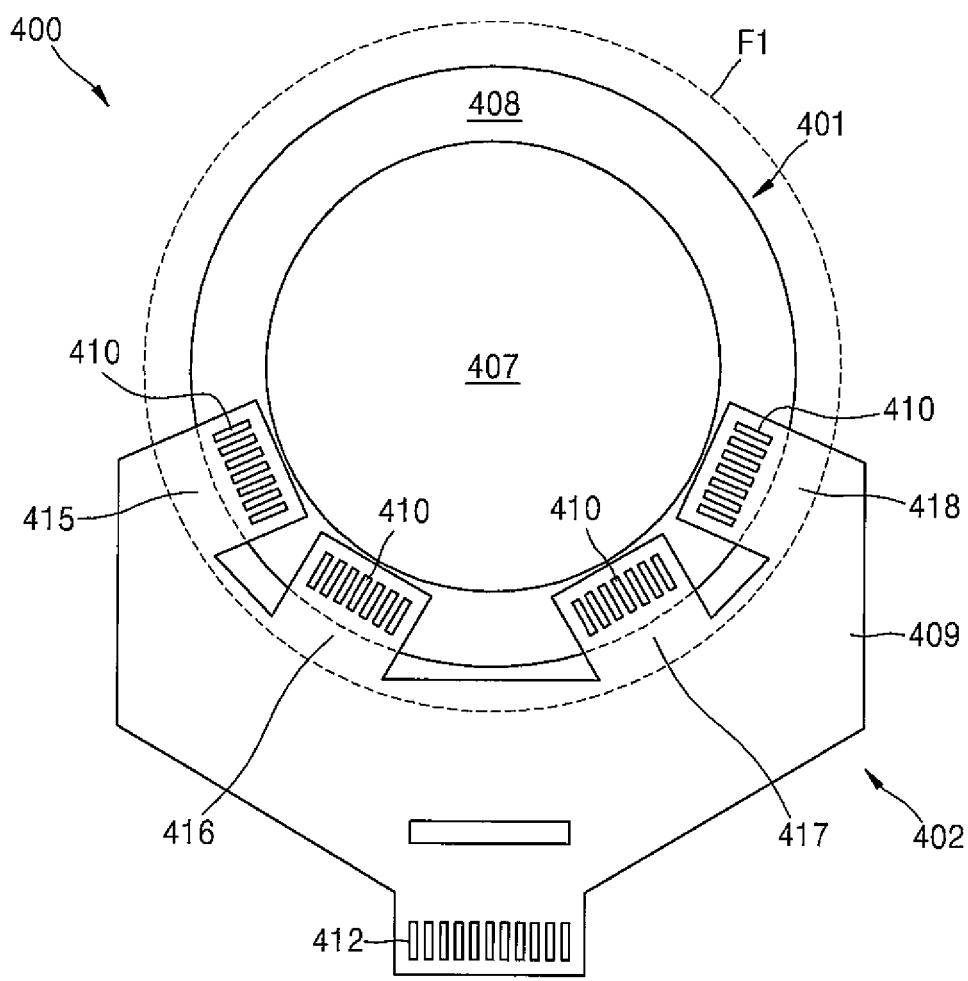
FIG. 4 is a plan view illustrating a state in which a circuit board is coupled to a pad of a display device according to another embodiment of the present invention.

FIG. 4 is a plan view illustrating a state in which a circuit board 402 is coupled to a pad of a display device 400 according to another embodiment of the present invention.

Referring to the figure, the display device 400 includes a display panel 401 and the circuit board 402.

A substrate 403 is provided in the display panel 401. The substrate 403 includes a display area 207 in which a display unit is disposed and a non-display area 408 outside of (e.g., extending to the outside of) the display area 407. A pad is disposed in the non-display area 408.

The pads are disposed along an outer profile of (e.g., along an outer periphery of) the display area 407 as described in FIG. 2A. In FIG. 2A, the pads included two pad groups which are separately disposed at angles different from each other; however, in the current embodiment, the pads include four pad groups which are separately disposed at angles different from each other.

The circuit board 402 is coupled to the four pad groups.

The circuit board 402 includes a flexible film 409, first terminals 410 coupled to the pads, and a second terminal 412 coupled to an external device.

A plurality of blocks 415 to 418 are disposed on the flexible film 409.

The plurality of blocks 415 to 418 include first, second, third, and fourth blocks 415, 416, 417, and 418 which each protrude from an edge of the flexible film 409. The first to fourth blocks 415 and 418 are separately disposed at angles different from each other.

The first to fourth blocks 415 to 418 have inclined angles which are substantially the same as the angles of the pads which are separately disposed along an outer profile of the display area 407 at angles different from each other (e.g., the angles of the first to fourth blocks 415 and 418 are substantially the same as the angles of the pads to which they are coupled to, respectively). The first terminals 410 respectively disposed at ends of the first to fourth blocks 415 to 418 may be disposed at angles corresponding to those of the pads of the pad groups to which they are coupled.

As described above, at least three pad groups disposed at angles different from each other and at least three blocks may be provided therein.

Also, the plurality of folding portions may be disposed on the flexible film 409, and thus, the flexible film 409 may be folded several times to reduce a space at which the circuit board 402 is coupled to the display panel 401 (e.g., to reduce a space surrounding the display panel 401 which is occupied by the circuit board 402).

Figure 5:
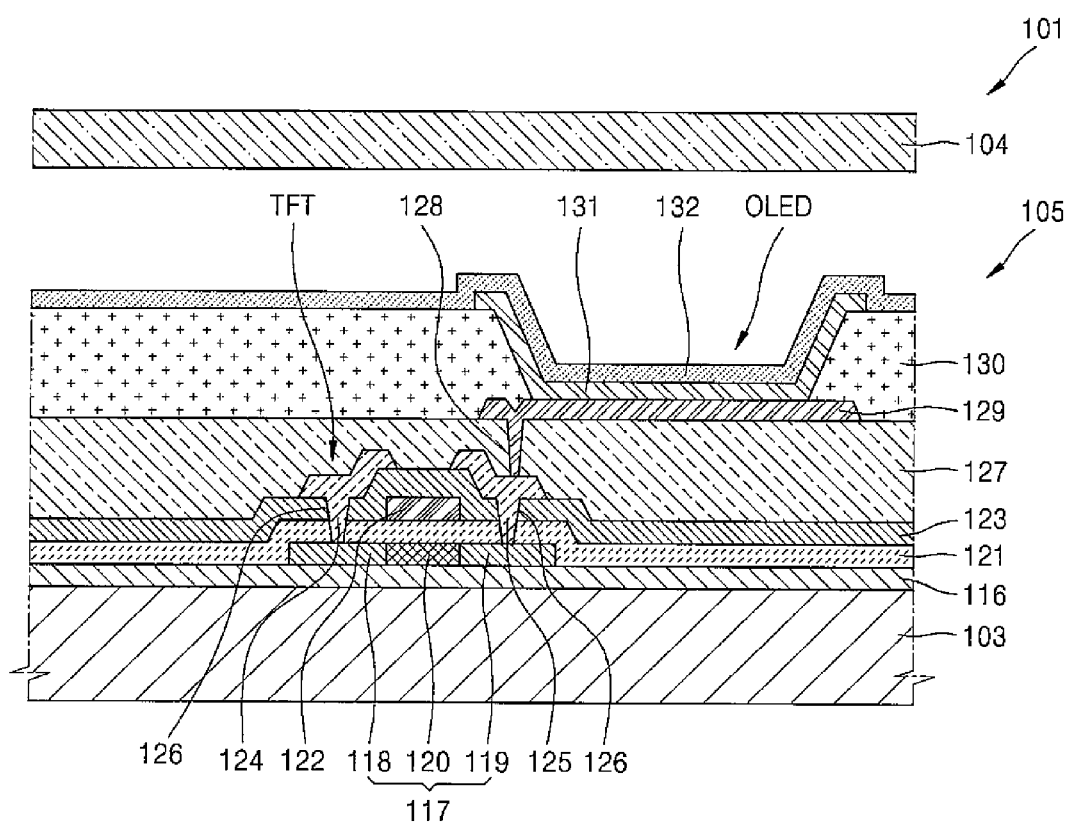
FIG. 5 is a cross-sectional view illustrating one sub pixel of the display panel 101 shown in FIG. 1.
Figure 6:
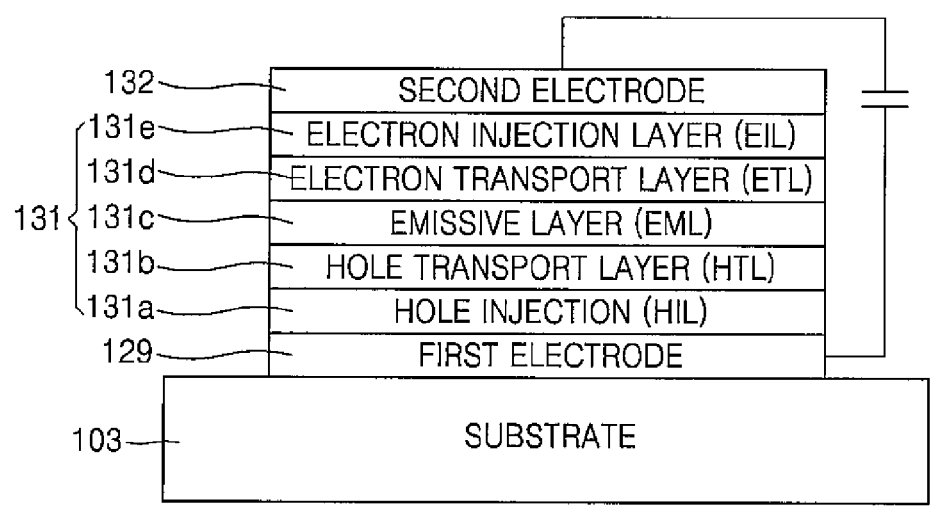
FIG. 6 is a schematic view of an organic light emitting device (OLED) shown in FIG. 1.

FIG. 5 is a cross-sectional view illustrating one sub pixel of the display panel 101 shown in FIG. 1, and FIG. 6 is a schematic view of the OLED shown in FIG. 1.

Referring to FIGS. 5 and 6, the display panel 101 includes the substrate 103, the display unit 105 disposed on the substrate 103 to realize (e.g., display) an image, and the sealing unit 104 for covering the display unit 105.

The substrate 103 may be formed of rigid glass or a flexible polymer. The sealing unit 104 may be a substrate formed of rigid glass, a polymer material, or a flexible film. The sealing unit 104 may be formed by alternately stacking an organic film and an inorganic film.

A barrier layer 116 may be disposed on the substrate 103. The barrier layer 116 may have an organic film structure, an inorganic film structure, or a structure in which the organic film and the inorganic film are alternately stacked on each other. The barrier layer 116 may prevent oxygen and moisture from permeating into the OLED.

A thin film transistor TFT may be disposed above the barrier layer 116. Although a top-gate thin film transistor is shown as the thin film transistor TFT in the current embodiment, the present disclosure is not limited thereto. For example, a thin film transistor having a different structure, such as a bottom-gate thin film transistor, may be applied to embodiments of the present invention.

A semiconductor layer active layer 117 is disposed on the barrier layer 116. The semiconductor active layer 117 may be formed of polycrystalline silicon but is not limited thereto. For example, the semiconductor active layer 117 may be formed of an oxide semiconductor.

For example, the oxide semiconductor may include oxides of a material selected from metal elements of group IV, group XII, group XIII, and group XIV, such as hafnium (Hf), zinc (Zn), indium (In), gallium (Ga), tin (Sn), cadmium (Cd), germanium (Ge), or combinations thereof.

The semiconductor active layer 117 may be formed to have a source region 118 and a drain region 119 by doping N-type impurity ions or P-type impurity ions on the semiconductor active layer 117. A region between the source region 118 and the drain region 119 may be a channel region 120 in which impurities are not doped.

A gate insulating layer 121 is deposited on the semiconductor active layer 117. The gate insulating layer 121 may include an inorganic film formed of oxide silicon, nitride silicon, or metallic oxide. The gate insulating layer 121 may have a single layer structure or a multi-layered structure.

A gate electrode 122 is disposed on the gate insulating layer 121. The gate electrode 122 may be provided as a single layer or multi-layer of gold (Au), silver (Ag), copper (Cu), nickel (Ni), platinum (Pt), palladium (Pd), aluminum (Al), molybdenum (Mo), chromium (Cr), or the like. Alternatively, the gate electrode 122 may be formed of an alloy, such as aluminum:neodymium (Al:Nd) or molybdenum:tungsten (Mo:W).

An interlayer insulating layer 123 is disposed on the gate electrode 122. The interlayer insulating layer 123 may be formed of an inorganic material, such as oxide silicon or nitride silicon. The interlayer insulating layer 123 may include an organic film.

A source electrode 124 and a drain electrode 125 may be disposed on the interlayer insulating layer 123. The gate insulating layer 121 and the interlayer insulating layer 123 may be selectively removed to form contact openings 126 (e.g., contact holes) in the gate insulating layer 121 and the interlayer insulating layer 123. The source electrode 124 may be electrically coupled to the source region 118 through one of the contact openings 126, and the drain electrode 125 may be electrically coupled to the drain region 119 through another one of the contact openings 126.

A protective layer (e.g., a passivation layer and/or planarization layer) 127 is disposed on the source electrode 124 and the drain electrode 125. The protective layer 127 may protect and/or planarize the thin film transistor TFT disposed thereunder. The protective layer 127 may be formed of various materials. That is, the protective layer 127 may be formed of an organic material, such as benzocyclobutene (BCB) or an acryl, or an inorganic material, such as silicon nitride ($SiN_x$). The protective layer 127 may be provided as a single layer or multilayer.

The OLED is disposed on the thin film transistor TFT.

To form the OLED, a first electrode 129 corresponding to a pixel electrode may be electrically coupled to one of the source electrode 124 and the drain electrode 125 through a contact opening 128 (e.g., contact hole).

The first electrode 129 may serve as an anode of the electrodes provided in the OLED. The first electrode 129 may be formed of various conductive materials. The first electrode 129 may be provided as a transparent electrode or a reflective electrode according to its purpose.

For example, when the first electrode 129 is the transparent electrode, the first electrode 129 may be formed of indium tin oxide (ITO), indium zinc oxide (IZO), zinc oxide (ZnO), or indium oxide ($In_2O_3$). When the first electrode 129 is the reflective electrode, a reflective layer may be formed by using Ag, Mg, Al, Pt, Pd, Au, Ni, Nd, Ir, Cr, or a compound thereof, and then, ITO, IZO, ZnO, or $In_2O_3$ may be formed on the reflective layer to form the reflective electrode.

A pixel definition layer (PDL) 130 covering an edge of the first electrode 129 of the OLED may be disposed on the protective layer 127. The pixel definition layer 130 may surround the edge of the first electrode 129 to define a light emitting region of each pixel.

The pixel definition layer 130 may be formed of an organic material or an inorganic material.

For example, the pixel definition layer 130 may be formed of an organic material, such as polyimide, a polyamide, benzocyclobutene, an acrylic resin, or a phenolic resin, or an inorganic material, such as SiNx. The pixel definition layer 130 may be modified to have various shapes, such as a single layer or multilayer.

An intermediate layer 131 may be disposed on a portion of the first electrode 129 that is exposed by etching a portion of the pixel definition layer 130. The intermediate layer 131 may be formed by a deposition process.

In the current embodiment, although the intermediate layer 131 is patterned to correspond to each sub pixel (e.g., only corresponding to the patterned first electrode 129), this is illustrated for convenience so as to explain the sub pixel, and thus, various embodiments may be applied.

The intermediate layer 131 may be formed of a low molecular weight organic material or a high molecular weight organic material.

For example, as illustrated in FIG. 6, the intermediate layer 131 may include an emissive layer (EML) 131c. Also, the intermediate layer 131 may further include at least one of a hole injection layer (HIL) 131a, a hole transport layer (HTL) 131b, an electron transport layer (ETL) 131d, and an electron injection layer (EIL) 131e. However, the current embodiment is not limited thereto. For example, the intermediate layer 131 may include an organic emissive layer, and may also further include other various functional layers.

Referring again FIG. 5, a second electrode 132 acting as a common electrode of the OLED may be disposed on the intermediate layer 131. The second electrode 132 may be provided as a transparent electrode or a reflective electrode, similar to the first electrode 129.

The first and second electrodes 129 and 132 may be insulated from each other by the intermediate layer 131. When a voltage is applied to the first and second electrodes 129 and 132, visible light may be emitted from the intermediate layer 131 to realize an image that is capable of being recognized by a user.

The second electrode 132 may be provided as the transparent electrode or the reflective electrode, similar to the first electrode 129.

When the second electrode 132 is the transparent electrode, a metal having a low work function, such as lithium (Li), calcium (Ca), lithium fluoride/calcium (LiF/Ca), lithium fluoride/aluminum (LiF/Al), aluminum (Al), magnesium (Mg), or a compound thereof, may be deposited on the intermediate layer 131, and then, an auxiliaryelectrode formed of a material for forming a transparent electrode, such as ITO, IZO, ZnO, or $In_2O_3$, may be further disposed on the deposited layer.

When the second electrode 132 is the reflective electrode, Li, Ca, LiF/Ca, LiF/Al, Al, Mg, or a compound thereof may be deposited on an entire surface of the intermediate layer 131 to form the reflective electrode.

When the first electrode 129 is formed as the transparent electrode or the reflective electrode, the first electrode may have a shape corresponding to an opening of each sub pixel. The second electrode 132 may be formed by depositing the transparent electrode or the reflective electrode on an entire surface of the display area.

Alternatively, the second electrode 132 may have various patterns instead of covering the entire display area. The first and second electrodes 129 and 132 may be stacked in a state in which positions of the first and second electrodes 129 and 132 are opposite to each other (e.g., the first and second electrode 129 and 132 face each other).

The sealing unit 104 is coupled to the OLED. The sealing unit 104 may protect the OLED and other thin films against external moisture and oxygen.

The sealing unit 104 may be rigid glass, a polymer resin, or a flexible film. Also, the sealing unit 104 may be formed by alternately stacking an organic film and an inorganic film on the OLED. In one embodiment, each of the organic film and the inorganic film may be provided in a plurality.

For example, the sealing unit 104 may have a structure in which at least one organic film formed of an epoxy, polyimide, polyethylene terephthalate, a polycarbonate, polyethylene, or polyacrylate and at least one inorganic film formed of silicone oxide ($SiO_2$), silicon nitride ($SiN_x$), aluminum oxide ($Al_2O_3$), titanium oxide ($TiO_2$), zirconium oxide ($ZrO_x$), or zinc oxide (ZnO).

As described above, in the display device according to one or more of the above embodiments of the present invention, the pad and the terminal of the circuit board may be easily coupled to optimize a space at which the pad and the terminal of the circuit board are coupled to each other.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A display device comprising:
    a display panel comprising a substrate having a display area and a non-display area outside the display area, a display unit being in the display area, and a plurality of pads being in the non-display area;
    a sealing unit covering the display unit; and
    a circuit board comprising a plurality of terminals electrically coupled to the plurality of pads,
    wherein the circuit board has a plurality of folding portions such that the circuit board is folded at least two times in directions different from each other, ones of the folding portions intersecting each other.

2. The display device of claim 1, wherein the circuit board comprises:
    a flexible film;
    a first terminal at a first edge of the flexible film, the first terminal being electrically coupled to the pads; and
    a second terminal at a second edge of the flexible film, the second terminal configured to be coupled to an external device,
    wherein the plurality of folding portions are foldable lines.

3. The display device of claim 2, wherein a portion folded at each of the folding portions is on a second surface of the substrate that is opposite to a first surface of the substrate on which the pads are arranged.

4. The display device of claim 2, wherein the plurality of folding portions comprise:
    a first folding portion extending in a first direction of the flexible film; and
    a second folding portion between the first edge of the flexible film and the first folding portion, the second folding portion extending across the flexible film.

5. The display device of claim 4, wherein the first folding portion extends in the same direction as a direction along which the plurality of pads are arranged.

6. The display device of claim 4, wherein a portion of the flexible film that is folded at least two times at the first and second folding portions is on a second surface of the substrate that is opposite to a first surface of the substrate on which the pads are arranged.

7. The display device of claim 2, wherein a plurality of slits are between the first and second edges of the flexible film.

8. The display device of claim 1, wherein the plurality of pads comprise a plurality of pad groups, each pad group being separately arranged along directions different from other ones of the pad groups.

9. The display device of claim 8, wherein the plurality of pad groups comprise a first pad group and a second pad group separately arranged along directions different from each other,
wherein the pads of the first pad group are arranged along an outer periphery of the display area, and
wherein the pads of the second pad group are arranged along the outer periphery of the display area.

10. The display device of claim 1, wherein the display panel has a circular shape.

11. The display device of claim 1, wherein the plurality of pads are arranged along an outer periphery of the display area, and
wherein each of the terminals of the circuit board has a shape corresponding to that of each of the pads, each terminal being coupled to a respective pad.

12. The display device of claim 1, wherein at least one portion of the substrate extends past an edge of the sealing unit, and the at least one portion corresponds to the non-display area at which the pads are arranged.

13. A display device comprising:
a display panel comprising a substrate having a display area and a non-display area outside the display area, a display unit being in the display area, and a plurality of pads being in the non-display area;
a sealing unit covering the display unit; and
a circuit board comprising:
a flexible film comprising a plurality of blocks separated from each other, a second block from among the plurality of blocks being separated from a first block from among the plurality of blocks and extending from a same edge of the flexible film at an angle different from that of the first block;
a plurality of first terminals respectively on the plurality of the blocks and electrically coupled to the plurality of pads; and
a second terminal on the flexible film, the second terminal configured to be coupled to an external device,
wherein the circuit board has a plurality of folding portions such that the circuit board is folded at least two times in directions different from each other, and
wherein the plurality of folding portions are foldable lines.

14. The display device of claim 13,
wherein the plurality of pads comprises a first pad group and a second pad group separately arranged along directions different from each other,
wherein the pads of the first pad group are arranged along an outer periphery of the display area, and the pads of the second pad group are arranged along the outer periphery of the display area, and
wherein the first terminals are respectively on the first and second blocks at angles corresponding to angles of the pads of the respective pad groups.

15. The display device of claim 13, wherein the plurality of folding portions comprise:
a first folding portion in each of the plurality of blocks; and
a second folding portion between the plurality of blocks and an edge of the flexible film and extending across the flexible film.

16. The display device of claim 15, wherein the first folding portion extends in the same direction as a direction along which the plurality of pads are arranged.

17. The display device of claim 15, wherein a portion of the flexible film that is folded at least two times at the first and second folding portions is on a second surface of the substrate that is opposite to a first surface of the substrate on which the pads are arranged.

18. A display device comprising:
a display panel comprising a substrate having a display area and a non-display area outside the display area, a display unit being in the display area, and a plurality of pads being in the non-display area;
a sealing unit covering the display unit; and
a circuit board comprising a plurality of terminals electrically coupled to the plurality of pads,
wherein the circuit board has a plurality of folding portions such that the circuit board is folded at least two times in directions different from each other,
wherein the plurality of pads comprise a plurality of pad groups, each pad group being separately arranged along directions different from other ones of the pad groups,
wherein the plurality of pad groups comprise at least three pad groups that are separated from each other, and
wherein the pads of each of the pad groups are at angles different from each other along an outer periphery of the display area with respect to a center of the display area.

19. The display device of claim 18, wherein the circuit board comprises:
a flexible film comprising a plurality of blocks separated from each other;
a plurality of first terminals respectively on the plurality of blocks, the plurality of first terminals being respectively coupled to the pads of the plurality of pad groups; and
a second terminal on the flexible film, the second terminal configured to be coupled to an external device.

20. The display device of claim 19, wherein the plurality of folding portions are foldable lines.

* * * * *